United States Patent
Asami

(10) Patent No.: US 8,572,145 B2
(45) Date of Patent: Oct. 29, 2013

(54) SIGNAL PROCESSING APPARATUS, DIGITAL FILTER AND RECORDING MEDIUM

(75) Inventor: Koji Asami, Saitama (JP)

(73) Assignee: Advantest Corporation, Tokyo (JP)

( * ) Notice: Subject to any disclaimer, the term of this patent is extended or adjusted under 35 U.S.C. 154(b) by 836 days.

(21) Appl. No.: 12/720,553

(22) Filed: Mar. 9, 2010

(65) Prior Publication Data
US 2010/0250638 A1    Sep. 30, 2010

(30) Foreign Application Priority Data
Mar. 25, 2009 (JP) ................ 2009-074869

(51) Int. Cl.
*G06F 17/10* (2006.01)

(52) U.S. Cl.
USPC ................ 708/316; 708/313; 708/319

(58) Field of Classification Search
USPC .................. 708/313, 316, 319
See application file for complete search history.

(56) References Cited

U.S. PATENT DOCUMENTS

| | | | | |
|---|---|---|---|---|
| 5,436,859 A | * | 7/1995 | Lunner et al. | 708/319 |
| 5,648,923 A | * | 7/1997 | Lane et al. | 708/319 |
| 6,775,321 B1 | * | 8/2004 | Soma et al. | 375/226 |
| 7,176,670 B2 | * | 2/2007 | Hausdorf et al. | 324/76.27 |
| 2003/0185405 A1 | * | 10/2003 | Spencer et al. | 381/77 |
| 2005/0185708 A1 | | 8/2005 | Yamaguchi et al. | |
| 2010/0312515 A1 | * | 12/2010 | Miyasaka | 702/106 |

FOREIGN PATENT DOCUMENTS

| | | |
|---|---|---|
| JP | H05136710 | 6/1993 |
| JP | H07170191 | 7/1995 |
| JP | H09270671 | 10/1997 |
| JP | 2005-233946 A | 9/2005 |

OTHER PUBLICATIONS

JP Office Action and English Translation Dated Septemeber 24, 2013; Application No. 2009-074869.

* cited by examiner

*Primary Examiner* — Chuong D Ngo

(57) ABSTRACT

Provided is a signal processing apparatus for compensating for a non-linear distortion of a digital signal, including: an analysis signal generating section that converts the digital signal into a analysis signal of a complex number, using a digital filter; and a compensation section that compensates for the analysis signal, using a compensation coefficient of a complex number corresponding to the non-linear distortion, where the digital filter divides data of the digital signal into "n" data sequences, assigns (n*L+k)th data of the digital signal to a k-th data sequence, performs filtering on each of the data sequences using a same filter coefficient, and combines each of the data sequences after the filtering, thereby generating an imaginary number portion of the analysis signal, where "n" is an integer equal to or greater than 2, L=0, 1, . . . , and k=1, 2, . . . , n.

14 Claims, 18 Drawing Sheets

SIGNAL PROCESSING APPARATUS, DIGITAL FILTER AND RECORDING MEDIUM

BACKGROUND

1. Technical Field

The present invention relates to a signal processing apparatus, a digital filter, and a recording medium.

2. Related Art

A signal processing apparatus generates a compensating signal using a complex number signal of a digital signal when compensating a non-linear distortion of the digital signal. Hilbert transform is known as a method to convert a digital signal into a complex number signal. Hilbert transform is described in Patent Document No. 1.
Patent Document No. 1: Japanese Patent Application Publication No. 2005-233946

A signal processing apparatus can perform Hilbert transform on a digital signal using a Hilbert filter that uses a digital signal processing circuit. The Hilbert filter is a type of band pass filter, whose frequency characteristic is defined according to the number of taps and the tap coefficient of the digital signal processing circuit, etc. So as to apply the Hilbert filter to various frequency bands, the number of taps should be increased, which unfavorably increases the circuit size.

SUMMARY

Therefore, it is an object of an aspect of the innovations herein to provide a signal processing apparatus, a digital filter, and a recording medium, which are capable of overcoming the above drawbacks accompanying the related art. The above and other objects can be achieved by combinations described in the independent claims. The dependent claims define further advantageous and exemplary combinations of the innovations herein.

According to an aspect related to the innovations herein, one exemplary signal processing apparatus for compensating for a non-linear distortion of a digital signal, includes: an analysis signal generating section that converts the digital signal into a analysis signal of a complex number, using a digital filter; and a compensation section that compensates for the analysis signal, using a compensation coefficient of a complex number corresponding to the non-linear distortion, where the digital filter divides data of the digital signal into "n" data sequences, assigns (n*L+k)th data of the digital signal to a k-th data sequence, performs filtering on each of the data sequences using a same filter coefficient, and combines each of the data sequences after the filtering, thereby generating an imaginary number portion of the analysis signal, where "n" is an integer equal to or greater than 2, L=0, 1, ..., and k=1, 2, ..., n.

According to an aspect related to the innovations herein, one exemplary digital filter for filtering a supplied digital signal divides data of the digital signal into "n" data sequences, assigns (n*L+k)th data of the digital signal to a k-th data sequence, performs filtering on each of the data sequences using a same filter coefficient, and combines each of the data sequences after the filtering, thereby generating an imaginary number portion of an analysis signal of the digital signal, where "n" is an integer equal to or greater than 2, L=0, 1, ..., and k=1, 2, ..., n.

According to an aspect related to the innovations herein, one exemplary recording medium has recorded therein a program to cause a computer to function as a signal processing apparatus for compensating for a non-linear distortion of a digital signal, including: an analysis signal generating section that converts the digital signal into a analysis signal of a complex number, using a digital filter; and a compensation section that compensates for the analysis signal, using a compensation coefficient of a complex number corresponding to the non-linear distortion, where the digital filter divides data of the digital signal into "n" data sequences, assigns (n*L+k)th data of the digital signal to a k-th data sequence, performs filtering on each of the data sequences using a same filter coefficient, and combines each of the data sequences after the filtering, thereby generating an imaginary number portion of the analysis signal, where "n" is an integer equal to or greater than 2, L=0, 1, ..., and k=1, 2, ..., n.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
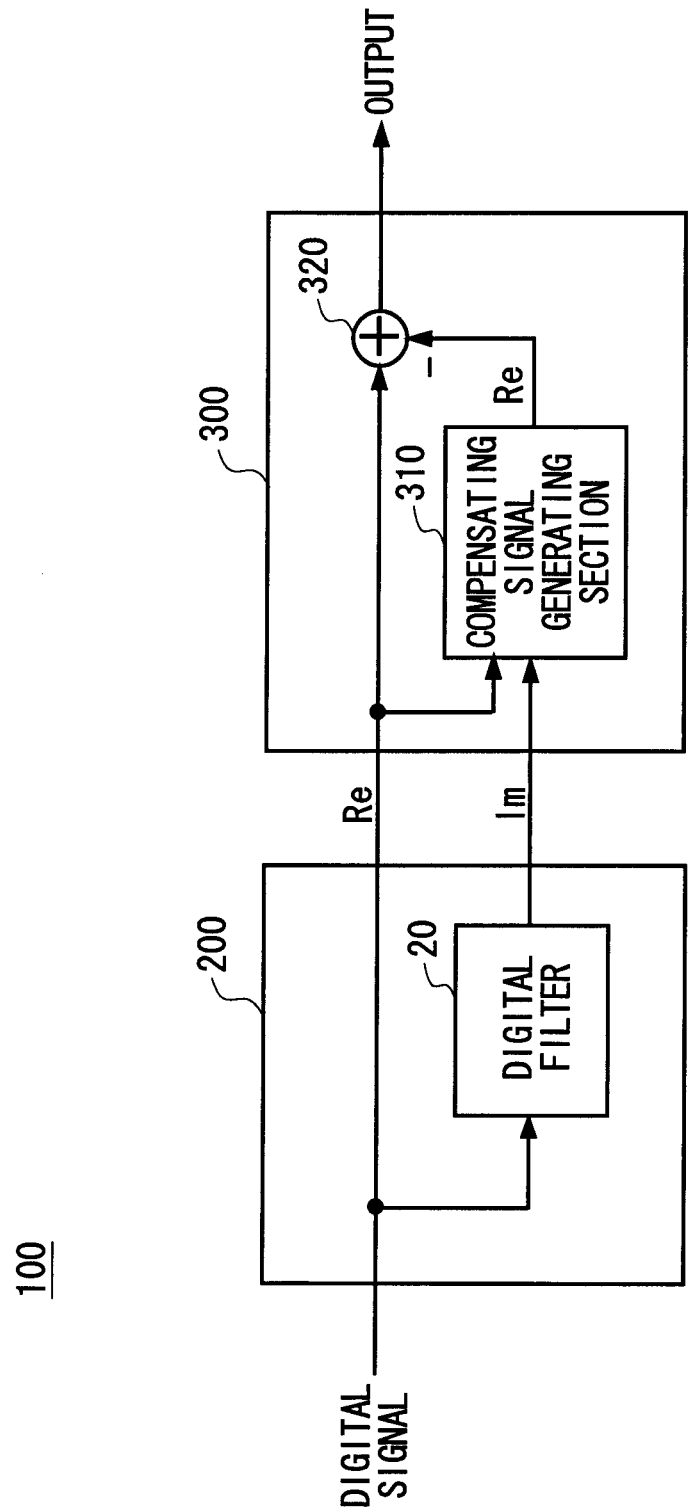
FIG. 1 shows a configuration of a signal processing apparatus 100 according to the present embodiment.

FIG. 1 shows a configuration of a signal processing apparatus 100 according to the present embodiment. The signal processing apparatus 100 compensates for a non-linear distortion of a digital signal. The signal processing apparatus 100 includes an analysis signal generating section 200 and a compensation section 300. The analysis signal generating section 200 uses the digital filter 20 to transform a digital signal into an analysis signal of a complex number. The compensation section 300 uses a compensation coefficient of a complex number corresponding to a non-linear distortion to compensate for the analysis signal. The digital signal may be a signal resulting from performing digital conversion on an analog signal using an analog-digital converter.

The digital filter 20 may be a band pass filter constituted by the digital signal processing circuit. The digital filter 20 may be a Hilbert filter constituted by a FIR filter or the like. A band of a supplied digital signal may be any band, and so the signal pass band of the digital filter 20 should preferably be variable.

When the digital filter 20 is a FIR filter, the frequency characteristic of the digital filter 20 is determined by the sampling frequency (corresponding to twice the Nyquist frequency), the number of taps, and the tap coefficient of the inputted digital signal. When the digital filter 20 has a fixed number of taps, there will be a tradeoff between the signal eliminating band ripple and the signal pass bandwidth determined by the tap coefficient. Concretely, when the signal eliminating band ripple is reduced, the signal pass bandwidth becomes narrow.

For example, the frequency characteristic of the digital filter 20 has a transition region in the vicinity of the DC as well as in the vicinity of the Nyquist frequency of the input signal. When the signal eliminating band ripple is reduced, the transition region becomes more smooth, to narrow the signal pass band. For this reason, it is difficult to achieve both of the reduction in ripple of the signal eliminating band and the widening of the signal pass band, in adjusting the tap coefficient.

Therefore, the digital filter 20 according to the present example adopts a method of lowering the sampling frequency of a digital signal, to widen the low-frequency signal pass band as well as reducing the signal eliminating band ripple. However, by lowering the sampling frequency, the SN ratio will decrease by generation of folding. Moreover, the digital signal band obtained by the sampling will become narrow.

The digital filter 20 can widen the signal pass bandwidth by increasing the number of taps, without changing the signal eliminating band ripple. However, if the number of taps in the digital filter 20 increases, the size of the digital signal processing circuit will also increase, which is unfavorable. In particular, when a programmable device such as FPGA is functioned as the digital filter 20, there will be a size restriction on its circuits, and so it is preferable to fix the number of taps.

In the signal processing apparatus 100 according to the present embodiment, the digital filter 20 will divide the data of a digital signal into n data sequences, where n is an integer equal to or greater than 2. Hereinafter, dividing data into n data sequences is referred to as "interleave of n channels." For example, when the number of pieces of data of a digital signal is 256, the digital filter 20 performs interleave of two channels to divide the data into two data sequences so that each data sequence contains 128 pieces of data. The digital filter 20 may also perform 4 channel interleave to divide the data into four data sequences so that each data sequence contains 64 pieces of data.

The digital filter 20 assigns (n*L+k)th data of a digital signal (L=0, 1 . . . ) to the k-th data sequence (k=1, 2, . . . , n) among the n data sequences. For example, when n=4, the digital filter 20 assigns the 1st, 5th, 9th, . . . , (4*L+1)th data to the first data sequence, and assigns the 2nd, 6th, 10th, . . . , (4*L+2)th data to the second data sequence.

The digital filter 20 performs filtering using a same filter coefficient on each data sequence. The digital filter 20 combines each data sequence having been filtered, to generate an imaginary number portion of an analysis signal. Furthermore, the digital filter 20 may delay the digital signal to generate a real number portion of the analysis signal.

The compensation section 300 generates a compensating signal based on the real number portion and the imaginary number portion of the analysis signal generated by the digital filter 20. The compensation section 300 according to the present example includes a compensating signal generating section 310 and a subtraction section 320. The compensating signal generating section 310 generates a compensating signal of a real number, based on an analysis signal of a complex number. The subtraction section 320 generates a signal whose non-linear distortion is compensated for, by subtracting the compensating signal outputted from the compensating signal generating section 310, from the real number portion of the analysis signal outputted from the analysis signal generating section 200.

Figure 2:
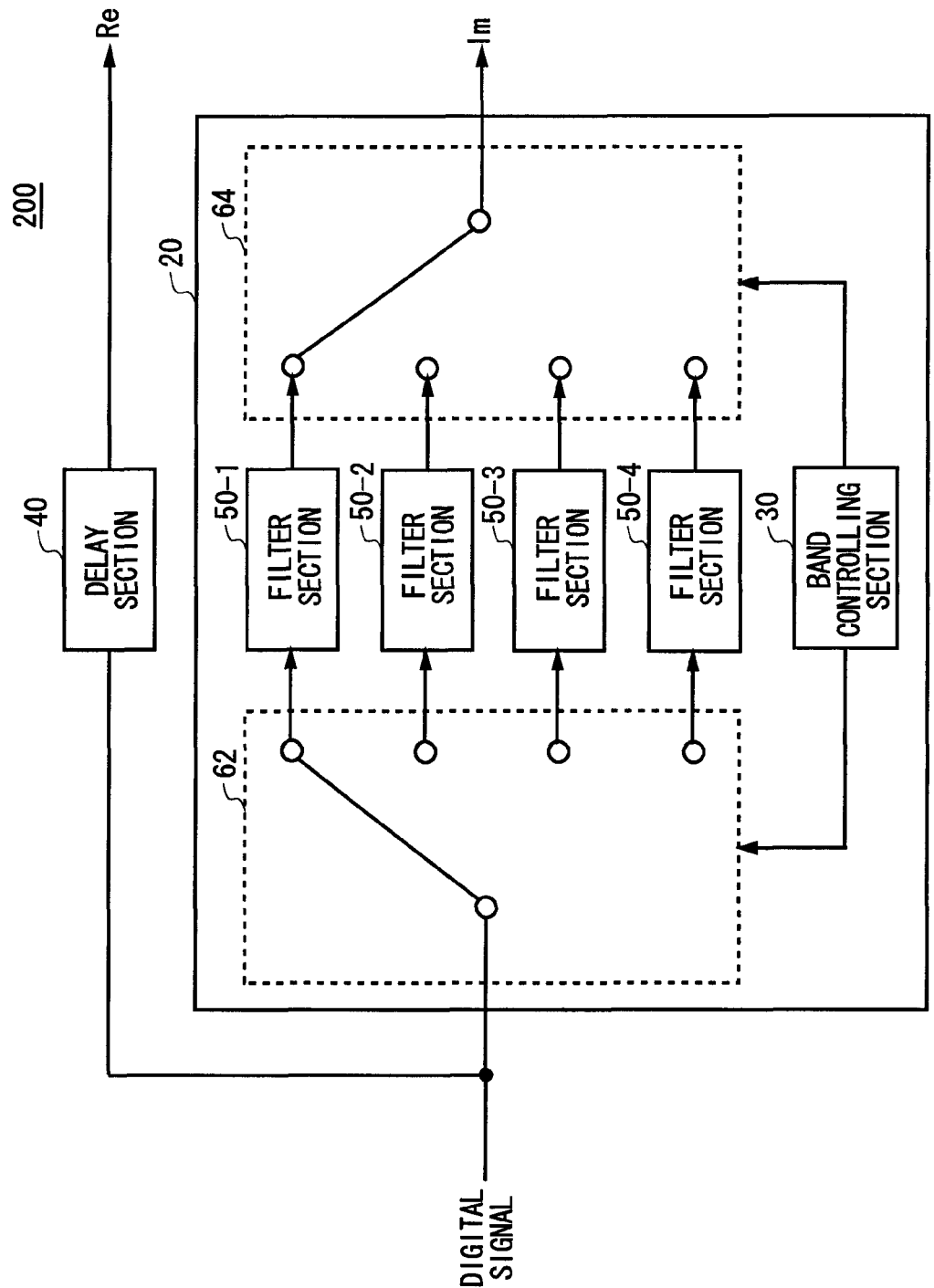
FIG. 2 shows an exemplary configuration of an analysis signal generating section 200.

FIG. 2 shows an exemplary configuration of an analysis signal generating section 200. In this drawing, the analysis signal generating section 200 includes a digital filter 20 and a delay section 40. The digital filter 20 generates a signal of an imaginary number portion of an analysis signal. The delay section 40 generates a signal of a real number portion of an analysis signal. The delay section 40 receives a digital signal in parallel with the digital filter 20, delays the digital signal by an amount of time corresponding to the delay time caused in the digital filter 20, to generate a real number portion of the analysis signal.

The band controlling section 30 controls the number of data sequences "n" in the digital filter 20. The band controlling section 30 controls the signal pass band of the digital filter 20 by means of the control.

The digital filter 20 includes $1^{st}$ to Nth filter sections 50 (50-1, 50-2, 50-3, . . . , 50-N) provided in parallel, each filter section 20 assigned the same filter coefficient. The digital filter 20 includes a data input section 62 that receives data so that the data of (N*L+K)th data of a digital signal is sequentially inputted to the k-th filter section 50-k, by distributing each piece of data of the digital signal to each filter section 50. Furthermore, the digital fitter 20 includes a combining section 64 that combines the signals outputted from each filter section 50.

For example, the data input section 62, by sequentially receiving data of a digital signal in different filter sections 50, divides the data of the digital signal into four data sequences, to input the divided data into a corresponding filter section 50. At each sampling time corresponding to a sampling period of a digital signal, the data input section 62 cycles through the filter sections 50 to which a digital signal is inputted.

The data input section 62 inputs the first data of the first data sequence into the filter section 50-1. After elapse of the sampling time, the data input section 62 inputs the second data of the second data sequence into the filter section 50-2. After elapse of the further sampling time, the data input section 62 inputs the third data of the third data sequence into the filter section 50-3. Likewise, the data input section 62 inputs the fourth data of the fourth data sequence into the filter section 50-4. Next, the data input section 62 inputs the fifth data of the first data sequence into the filter section 50-1, etc.

According to the repetition of the switching operation for each sampling time by the data input section 62, each filter section 50 receives data at each time corresponding to "sampling time multiplied by the number of channels," to perform filtering according to the data input. The combining section 64 generates an imaginary number portion of an analysis signal, by obtaining, from each filter section 50, the data sequences resulting after filtering, and combining the obtained data sequences. The combining section 64 may cycle through the filter sections 50 to obtain the data, in synchronization with the data input section 62. The combining section 64 may select the same filter section 50 as selected by the data input section 62, or may select a filter section 50 different in number from the number of the filter section 50 selected by the data input section 62 by a predetermined number.

Figure 3:
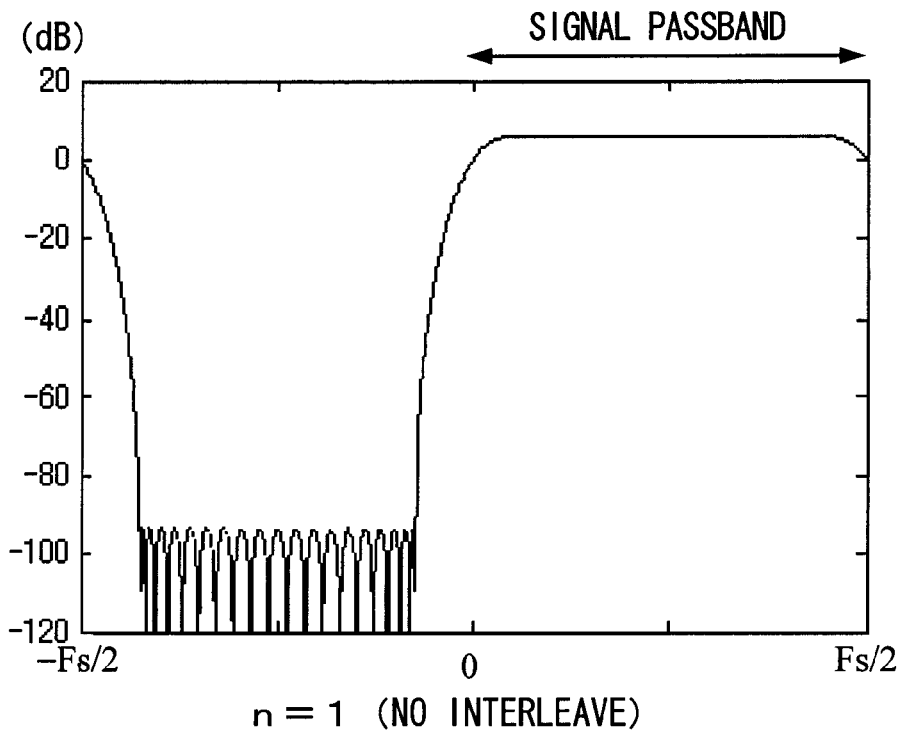
FIG. 3 shows a frequency characteristic of a digital filter 20 when n=1.
Figure 4:
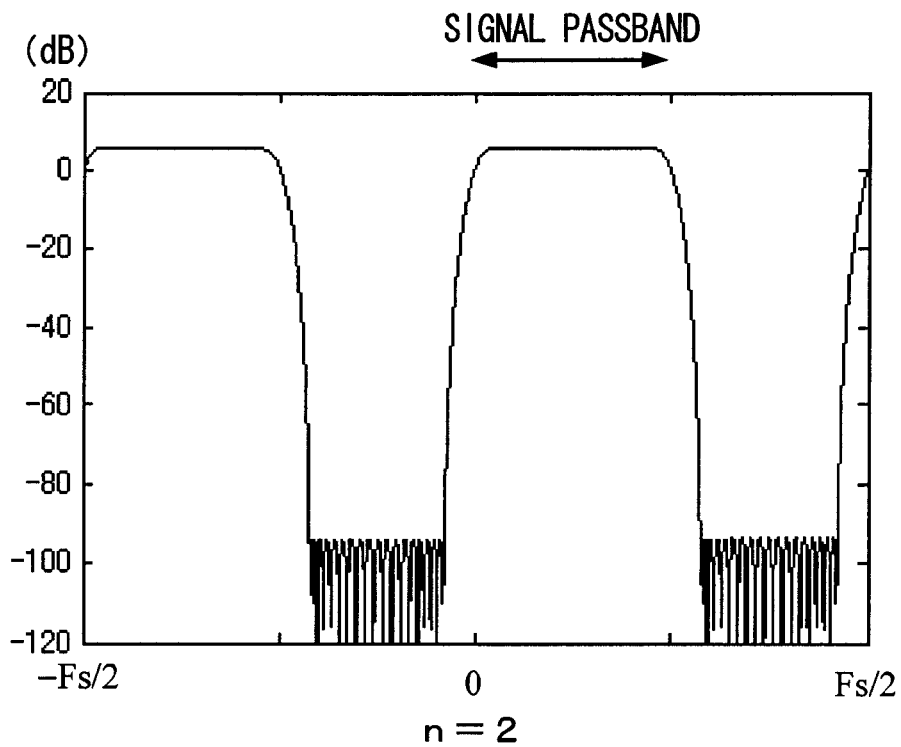
FIG. 4 shows a frequency characteristic of a digital filter 20 when n=2.
Figure 5:
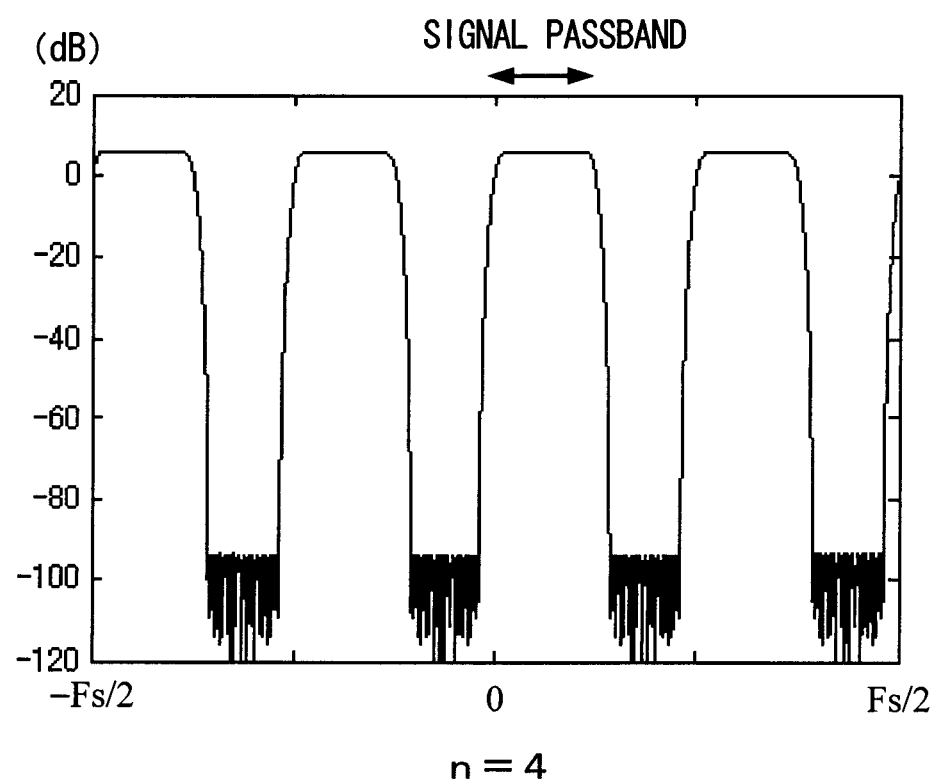
FIG. 5 shows a frequency characteristic of a digital filter 20 when n=4.

FIG. 3 shows a frequency characteristic of a digital filter 20 when n=1 (when not performing interleave). FIG. 4 shows a frequency characteristic of a digital filter 20 when n=2. FIG. 5 shows a frequency characteristic of a digital filter 20 when n=4.

In each of the above-stated drawings, the lateral axis represents a frequency, and the longitudinal axis represents a gain (dB) of the digital filter 20. Fs/2 in the lateral axis indicates ½ frequency of the sampling frequency. When n=1, it is shown that the first Nyquist region between the frequencies of 0 and Fs/2 corresponds to the signal pass band.

Comparing FIG. 3 to FIG. 4, when n=2, the signal pass band is shifted towards the lower frequencies compared to the case of n=1. Although the signal pass band has shifted towards the lower frequencies, the sampling frequency stays unchanged. Therefore, when n=2, the filter allows, to pass, both of a predetermined fundamental component and a signal of lower frequencies. Comparing FIG. 4 to FIG. 5, it is shown that the signal pass band can be further controlled by setting n=4.

From FIG. 3 through FIG. 5, as the number (the number of interleaved channels) "n" increases, the rising edge and the falling edge of the transition region in the signal pass band becomes more precipitous. For example when n=4, the change in gain of the digital filter 20 is more precipitous than the change when n=1. As a result, the frequency not contained in the signal pass band when n=1 is contained in the signal pass band when n=4. In other words, the band controlling section 30 controls the number "n," to control the low-frequency cutoff frequency of the signal pass band in the digital filter 20.

The band controlling section 30 can control the number "n" so that the low-frequency cutoff frequency of the signal pass band in the digital filter 20 will be lower than the frequency of the fundamental waves of the digital signal. For example, when the low-frequency cutoff frequency is 1 MHz for the digital filter 20 having n=1, this digital filter 20 does not allow, to pass, a digital signal having a fundamental wave frequency of 100 KHz. If, however, the digital filter 20 is controlled to have a low-frequency cutoff frequency to be 50 KHz by setting the number "n" to be 4, it can allow a digital signal having a fundamental wave frequency of 100 KHz to pass.

As explained above, the digital filter 20 according to the present embodiment can control the number "n" of data sequences, to widen the pass band of a signal as well as to control the low-frequency cutoff frequency of the signal pass band, without increasing the number of taps. Consequently, the digital filter 20 according to the present embodiment can set the signal pass band suitable for a digital signal, without the need to increase the size of the digital signal processing circuit.

Also as explained above with reference to FIG. 1, the signal processing apparatus 100 only uses the imaginary number portion of an analysis signal in generating a compensating signal in the compensating signal generating section 310, and does not use the imaginary number portion of an analysis signal in compensation performed by the subtraction section 320. Therefore, it is sufficient that the digital filter 20 allow a fundamental component of a digital signal to pass, and does not have to allow the harmonic component thereof to pass (or may allow it to pass). Therefore, as shown in FIG. 4 and FIG. 5, even when the higher frequency band becomes comb-like due to enlargement of the lower frequencies of the signal pass band according to the fundamental wave frequency of a digital signal, it does not affect the operation of the signal processing apparatus 100.

Figure 6:
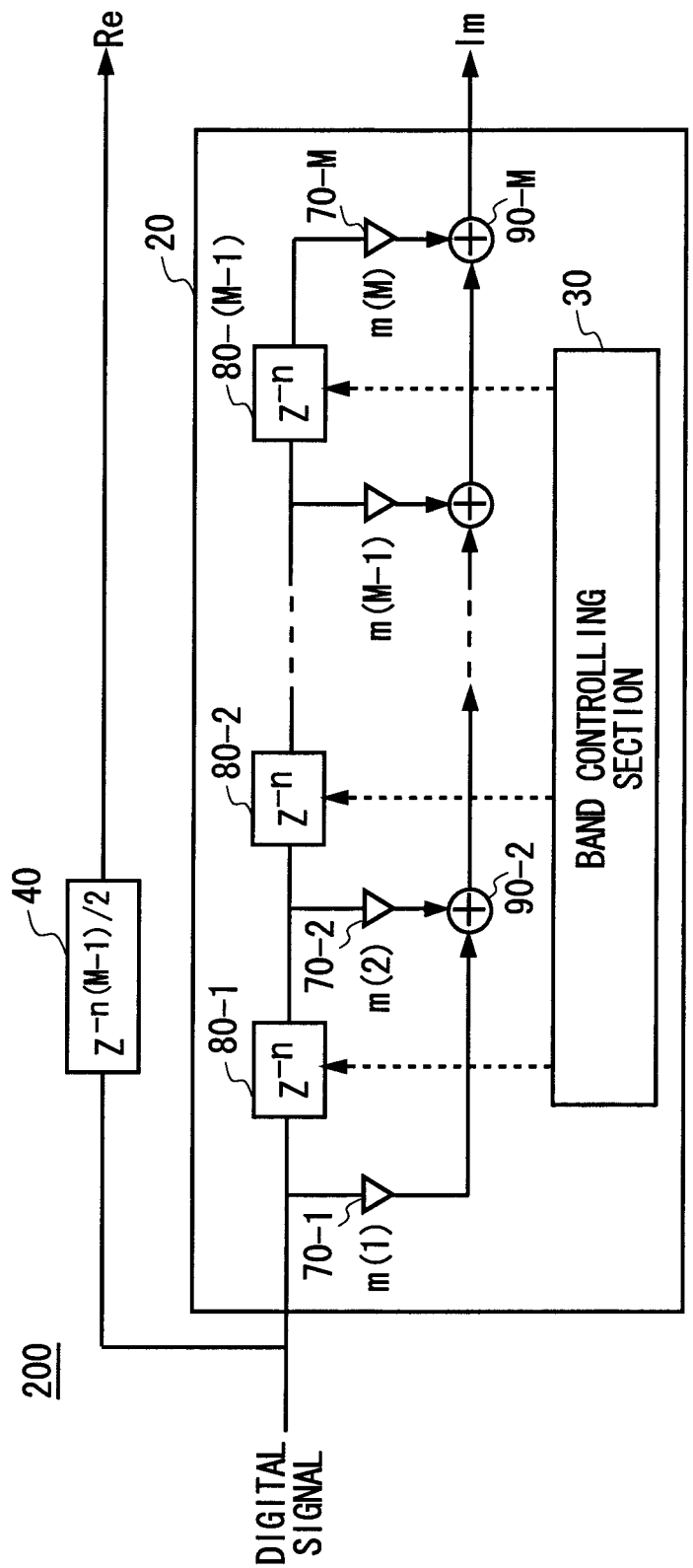
FIG. 6 shows a concrete exemplary configuration of a digital filter 20 according to the present embodiment.

FIG. 6 shows a concrete exemplary configuration of an analysis signal generating section 200 according to the present embodiment. The analysis signal generating section 200 includes a digital filter 20 and a delay section 40. The digital filter 20 is a FIR filter having M taps.

The digital filter 20 includes a plurality of multipliers 70 (70-1, 70-2, . . . , 70-x, . . . 70-M) provided in association with respective taps x, a plurality of delay sections 80 (80-1, 80-2, . . . , 80-x, . . . , 80-(M−1)), and a plurality of adders 90 (90-2, . . . , 90-x, . . . , 90-M).

The multiplier 70-x multiplies the data of the digital signal inputted to the corresponding tap x by the filter coefficient to calculate a multiplication value. The delay section 80-x is provided between each taps (e.g. between tap x and tap x+1), and delays the data transmitted between taps by a predetermined amount of delay.

The band controlling section 30 controls the delay amount in the delay section 80 based on the value resulting from multiplying the sampling period of a digital signal by the number "n." Concretely, when the amount of delay corresponding to one sampling period of a digital signal is represented by $z^{-1}$, the band controlling section 30 sets the amount of delay of each delay section 80 to be $z^n$. Here, "$z^n$" is equal to a delay time corresponding to "n" times the sampling period of the digital signal. Therefore, the amount of delay in one delay section 80 corresponds to a time period obtained by multiplying a switching time in the data input section 62 and the combining section 64 in FIG. 5 by the number of filter sections 50.

In FIG. 6, the digital signal is inputted to the multiplier 70-1 and the delay section 80-1 in parallel. The multiplier 70-1 multiplies the data of the inputted digital signal by the filter coefficient determined for each tap, to calculate a multiplication value. The multiplier 70-1 outputs the data after multiplication to the adder 90-2 at the later-stage tap.

The delay section 80-1 delays the data of the inputted digital signal by the amount of delay $z^{-n}$. The delay section 80-1 outputs the delayed data to the multiplier 70-2 and the delayer 80-2 at the later-stage tap. The adder 90-2 adds the data outputted from the multiplier 70-1 at the previous-stage tap and the data outputted by the multiplier 70-2 at the same tap. The digital filter 20 repeats the explained multiplication, delaying, and adding to all the taps, to generate an imaginary number portion of an analysis signal from the signal outputted by the adder 90-M.

The delay section 40 delays the digital signal based on the number of taps M and the number n at the digital filter 20, to generate a real number portion of the analysis signal. For example, the delay section 40 delays the signal inputted to the digital filter 20, by a delay time $z^{-n(M-1)/2}$ that corresponds to half the delay time $z^{-n(M-1)}$, to generate the real number portion of the analysis signal.

As stated above, the digital filter 20 according to the present embodiment controls the amount of delay in each delay section 80 to change the number of the divided digital signals. Concretely, the digital filter 20 sets the amount of delay in each delay section 80, to correspond to the amount resulting from multiplying the sampling period by the number of divided digital signals. As a result, the digital filter 20 can widen the pass band of a signal as well as controlling the low-frequency cutoff frequencies of a signal pass band, without increasing the number of taps.

Note in the example explained with reference to FIG. 2, each filter section 50 has the same configuration as that of the digital filter 20 shown in FIG. 6. Note that each filter section 50 has n=1 in FIG. 2. Meanwhile, the digital filter 20 in the present example controls the amount of delay between taps, to realize an interleavable filter by means of one circuit of the filter section 50. This helps reduce the circuit size.

Figure 7:
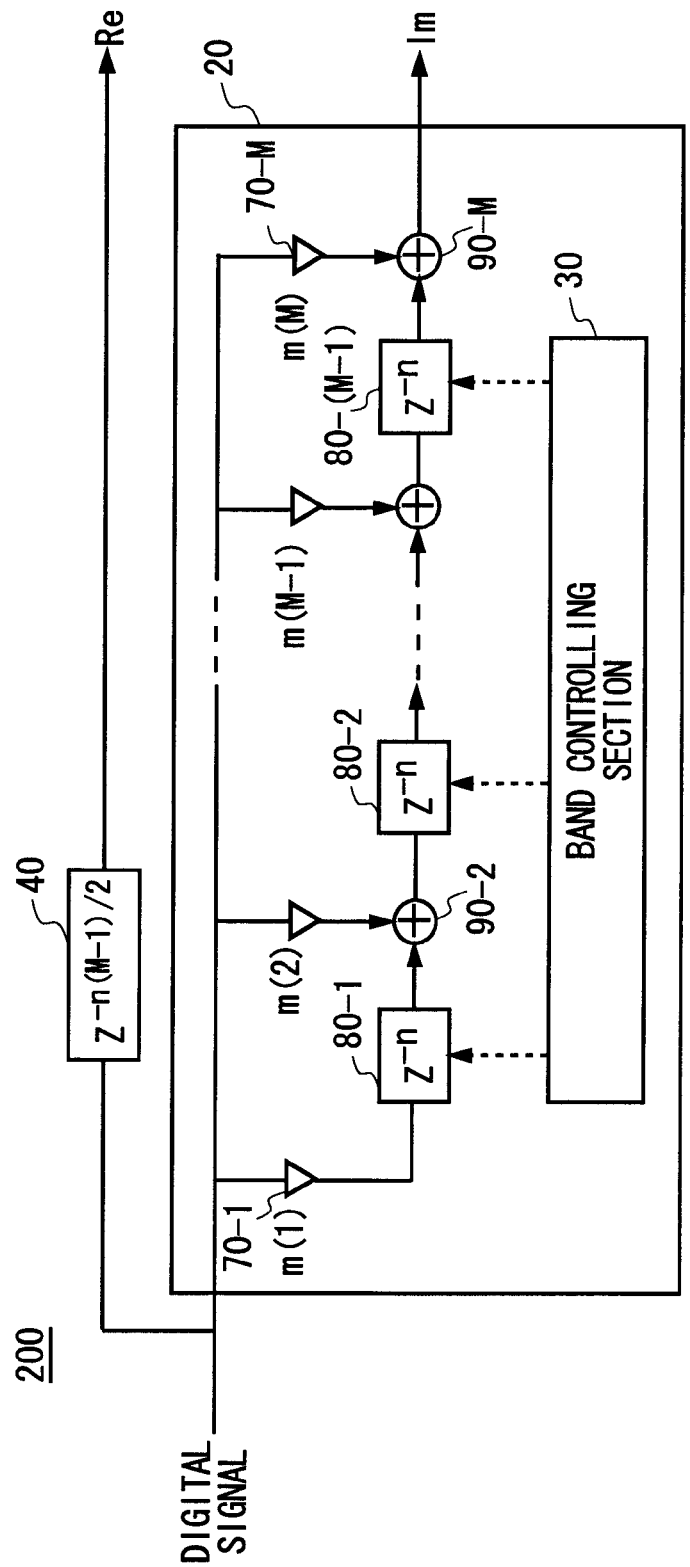
FIG. 7 shows a modification example of FIG. 6.

FIG. 7 shows a modification example of FIG. 6. In the present drawing, the data of the inputted digital signal is simultaneously inputted to respective multipliers 70. The multiplier 70-1 outputs, to the delay section 80-1, the multiplication value obtained by multiplying corresponding data by a predetermined coefficient. The other multipliers 70 outputs the respective multiplication values to the adder 90 of the same tap.

Each adder 90 adds the data outputted from the delay section 80 in the previous tap, and the multiplication value outputted by the multiplier 70 in the same tap. The multiplier 70, the delay section 80, and the adder 90 in each tap sequentially repeat the same processing, to cause the adder 90-M to output the data of the imaginary number portion of the digital signal.

Figure 8:
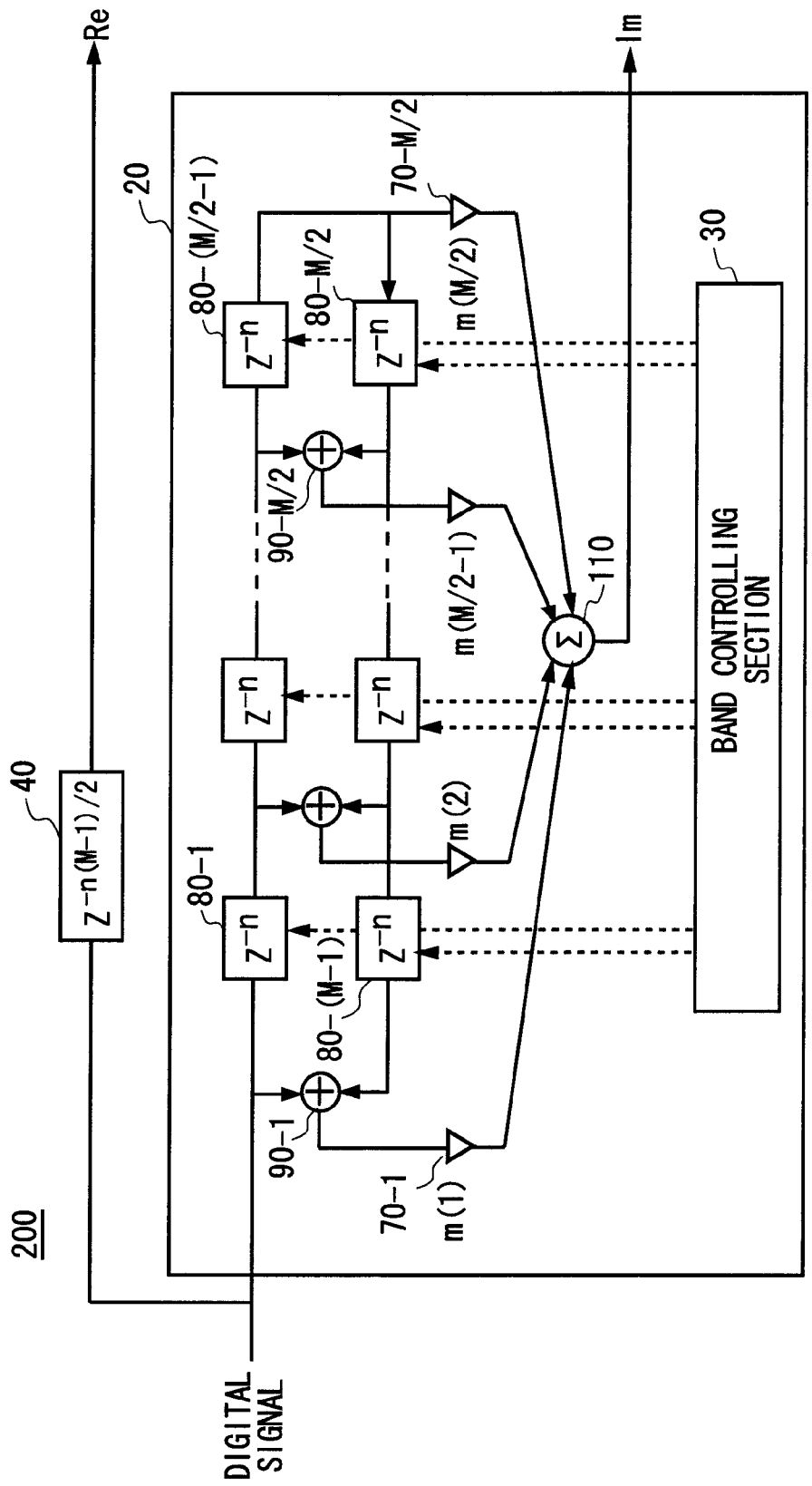
FIG. 8 shows a digital filter 20 according to another embodiment.

FIG. 8 shows a digital filter 20 according to another embodiment. In this drawing, the digital filter 20 uses a symmetrical property of the coefficient, to set the number of taps to be M/2 of the number of taps of the digital filter 20 of FIG. 6 and FIG. 7, to reduce half of the number of multipliers 70.

The digital filter 20 sequentially propagates the data of the inputted digital signal from the delay section 80-1 to the delay section 80-(M/2-1), by delaying the data in each delay section 80 by the amount of delay of $z^{-n}$. The delay section 80-(M/2-1) sequentially outputs the delayed data to the multiplier 70-M/2, and simultaneously outputs it to the delay section 80-M/2. The digital filter 20 sequentially propagates the data inputted to the delay section 80-M/2 up to the delay section 80-(M-2).

The adder 90 provided in each tap adds data outputted from any delay section 80 from the delay section 80-1 to the delay section 80-(M/2-1) connected to each tap, and data outputted from any delay section 80 from the delay section 80-M-2 to the delay section 80-(M-2) connected to each tap.

Each multiplier 70 outputs, to the adding section 110, a multiplication value obtained by multiplying the data outputted from the adder 90 of the same tap by a predetermined coefficient. For example, the multiplier 70-1 outputs, to the adding section 110, a multiplication value obtained by multiplying the data outputted from the adder 90-1 by a predetermined coefficient. The adding section 110 generates an imaginary number portion of an analysis signal by adding the multiplication values outputted from the respective multipliers 70.

According to the described configuration, the digital filter 20 can constitute an interleavable filter, by means of half the number of the multipliers 70 used in the digital filters 20 shown in FIG. 6 and FIG. 7. As a result, the signal processing apparatus 100 can reduce the circuit size of the digital filter 20.

Figure 9:
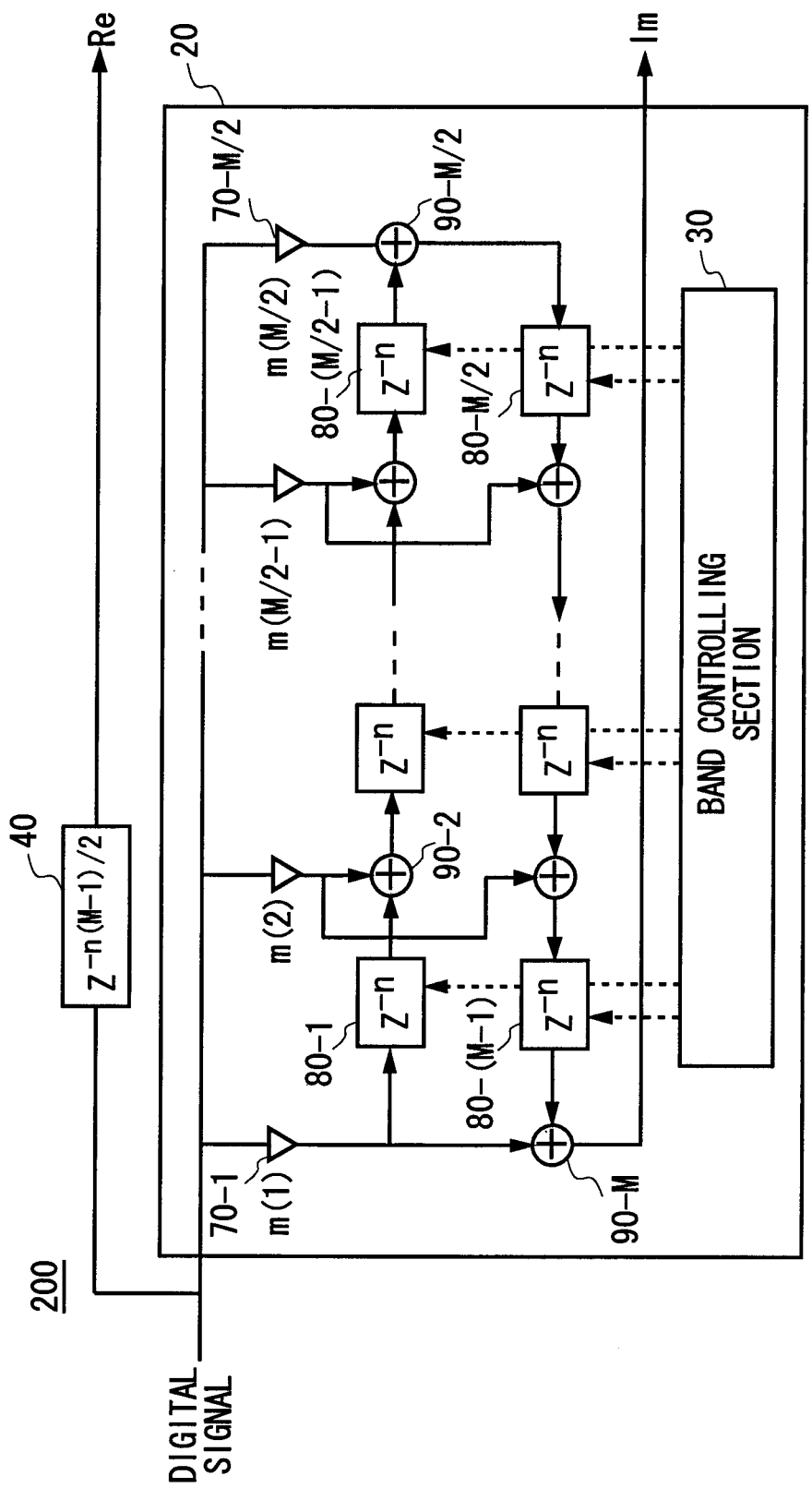
FIG. 9 shows a modification example of FIG. 8.

FIG. 9 shows a modification example of FIG. 8. In this drawing, the data of the inputted digital signal is simultaneously inputted to each multiplier 70. The multiplier 70 at each tap outputs a multiplication value obtained by multiplying corresponding data by a predetermined coefficient, to the adder 90 at the same tap.

The adder 90 adds the data outputted from the multiplier 70 connected to each tap and data outputted from the delay section 80 positioned between the current-stage tap and the previous-stage tap. Each delay section 80 delays the data inputted from the previous-stage adder 90 by the delay amount of z-n, and outputs the result to the later-stage adder 90. The data inputted to the delay section 80-1 is sequentially propagated up to the delay section 80-(M-2), before being outputted to the adder 90-M. The adder 90-M adds the data outputted from the multiplier 70-1 at the same tap and the data outputted from the delay section 80-(M-2), to generate an imaginary number portion of the analysis signal.

Figure 10:
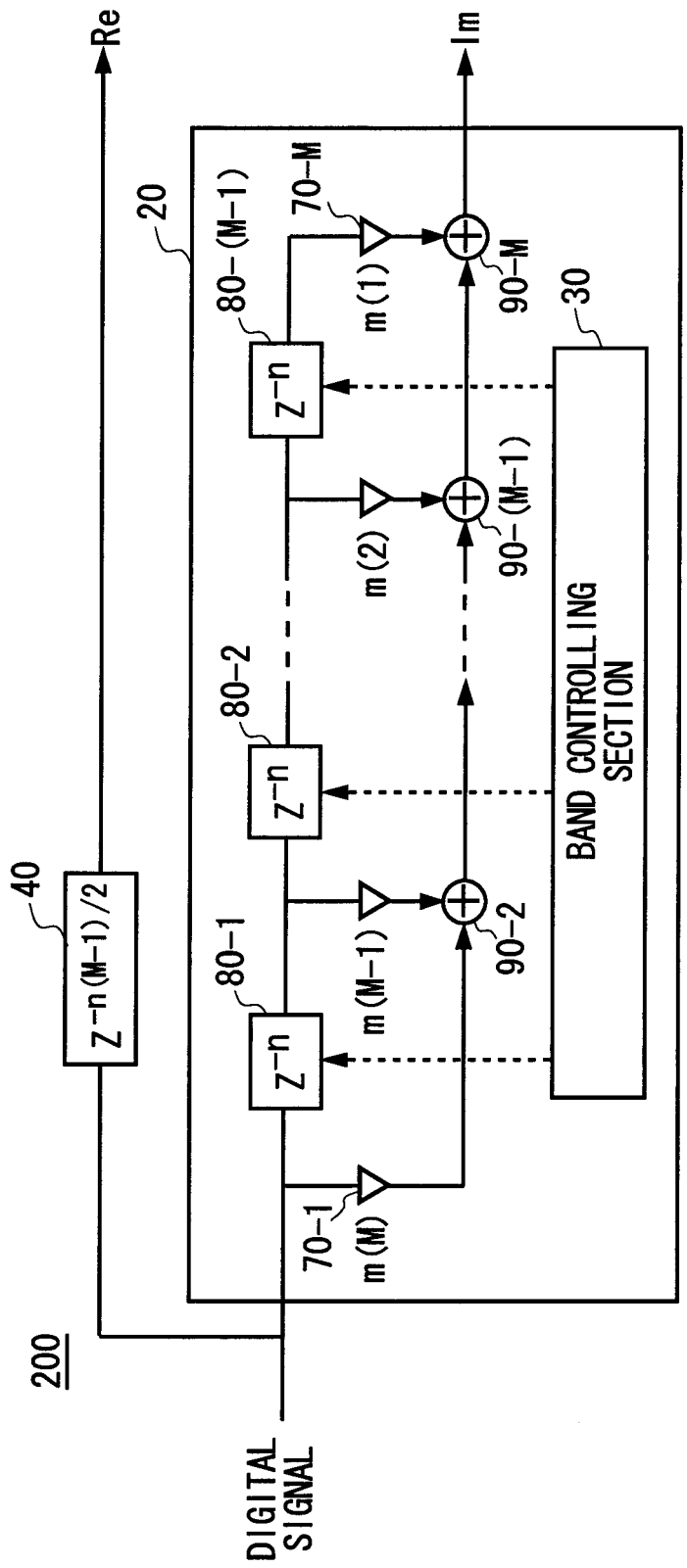
FIG. 10 shows a configuration of a digital filter 20 according to another embodiment.

FIG. 10 shows a configuration of a digital filter 20 according to another embodiment. The digital filter 20 according to the present embodiment sequentially sets the multiplication value obtained according to the filter coefficient in each tap, according to the order of the tap. The band controlling section 30 reverses the order of the multiplication value to each tap, thereby controlling the signal pass band in the digital filter 20.

Specifically, the configuration of the digital filter 20 shown in FIG. 10 is the same as the configuration of the digital filter 20 shown in FIG. 6, except that the coefficient of the multiplier 70 in each tap is different. For example, the coefficient used for the multiplier 70-1 in FIG. 10 is the same as the coefficient used for the multiplier 70-M in FIG. 6. The coefficient used for the multiplier 70-M in FIG. 10 is the same as the coefficient used for the multiplier 70-1 in FIG. 6. According to this configuration, the digital filter 20 can switch the signal pass band to the second Nyquist region. This example has a basis on the configuration of the digital filter 20 shown in FIG. 6, with the reversed order of the multiplication values. Alternatively, it is possible to use as a basis the configuration of any of the digital filters 20 shown in FIG. 7 through FIG. 9, with the reversed order of the multiplication values.

Figure 11:
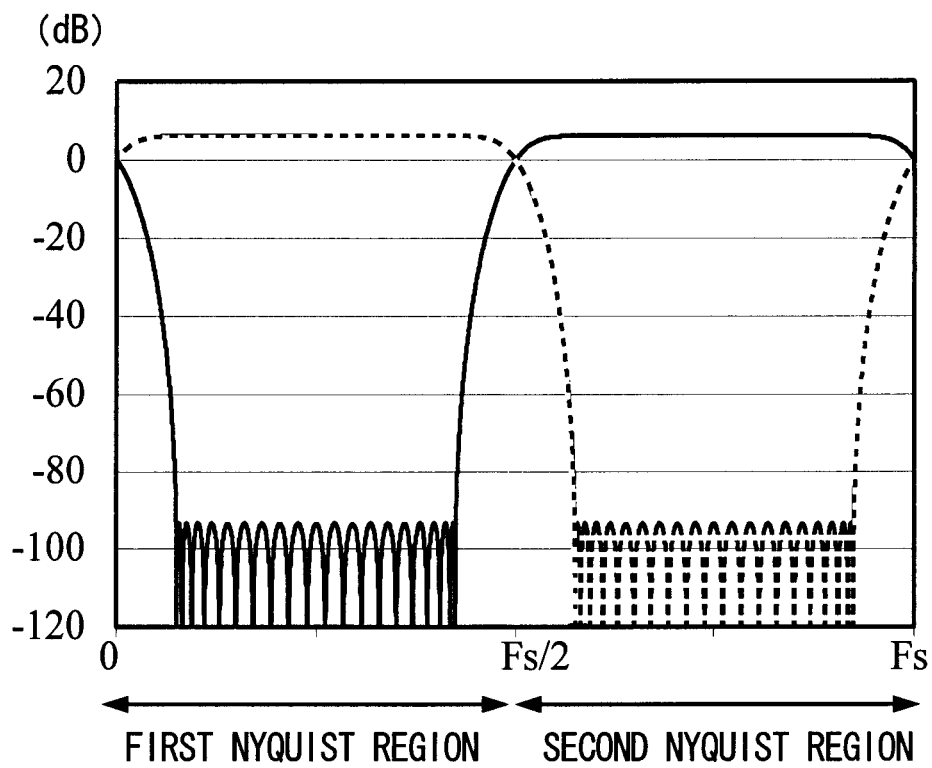
FIG. 11 shows frequency characteristics of a digital filter 20 shown in FIG. 6 and of a digital filter 20 shown in FIG. 10.

FIG. 11 shows frequency characteristics of a digital filter 20 shown in FIG. 6 and of a digital filter 20 shown in FIG. 10. In this drawing, the broken line shows the frequency characteristic of the digital filter 20 of FIG. 6. The solid line shows the frequency characteristic of the digital filter 20 in FIG. 10. Each digital filter 20 has the frequency characteristic where a signal pass band and a signal eliminating band alternate. According to the configuration of the present embodiment, the digital filter 20 can easily switch the region to pass a signal to either the first Nyquist region or the second Nyquist region, according to a signal under measurement.

Figure 12:
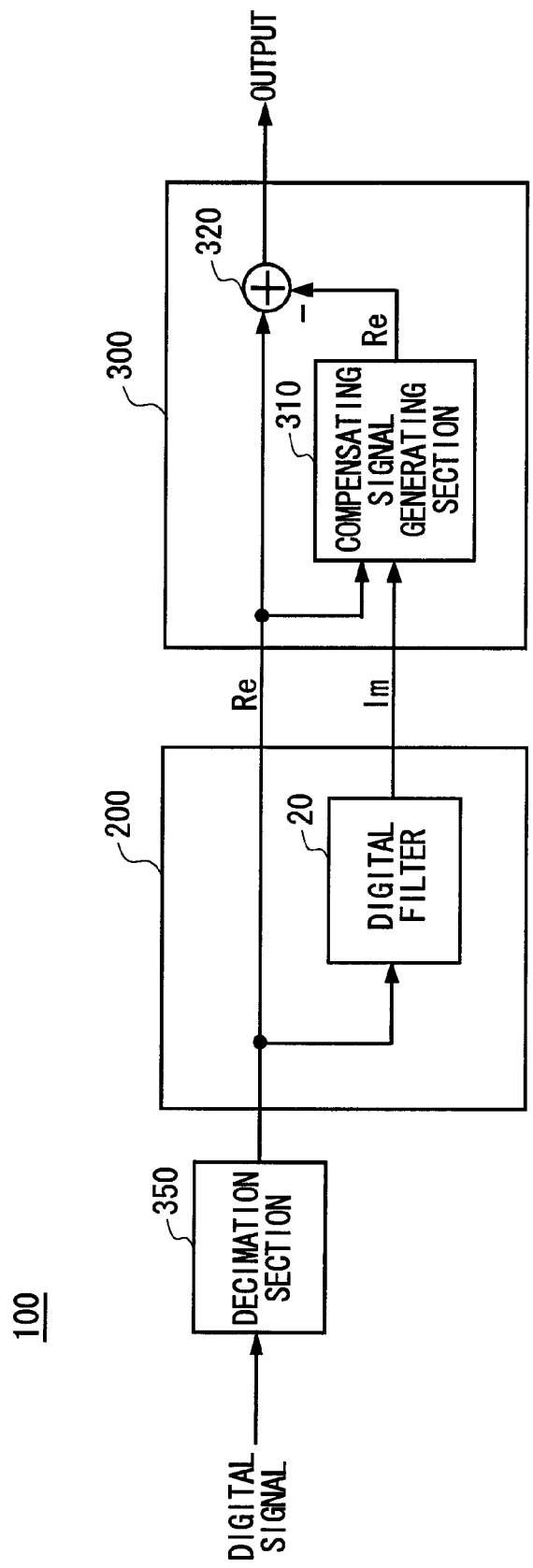
FIG. 12 shows a configuration of a signal processing apparatus 100 according to another embodiment.

FIG. 12 shows a configuration of a signal processing apparatus 100 according to another embodiment. The digital filter 20 can control a signal pass band according to the number "n" of data sequences. Therefore, the number "n" of data sequences can be determined according to the frequency of the signal to be analyzed, in designing the digital filter 20.

When analyzing an analog signal, the signal processing apparatus 100 converts the analog signal into a digital signal by means of an analog/digital converter, to input a digital signal after conversion to the digital filter 20. So as to enable analysis of an analog signal of a wide frequency band, the sampling frequency in the analog/digital converter is selected according to the maximum frequency of the inputted analog signal.

Therefore, when analyzing an analog signal having a frequency lower than the maximum frequency, the sampling frequency is unreasonably high. When the sampling frequency is high, the operating frequency of the digital filter 20 also becomes high, which unfavorably increases power consumption and radiation noise.

Therefore, the signal processing apparatus 100 according to the present embodiment further includes a decimation section 350 in addition to the signal processing apparatus 100 shown in FIG. 1. The decimation section 350 reduces the number of pieces of data of a digital signal, and inputs the result to the digital filter 20. For example, the decimation section 350 may perform selection on the pieces of sampling data of a digital signal at a predetermined interval, and input the selected pieces of data to the digital filter 20. According to this configuration, the digital filter 20 can constitute the filter operating at an optimal sampling frequency according to the frequency of a signal to be analyzed.

Figure 13:
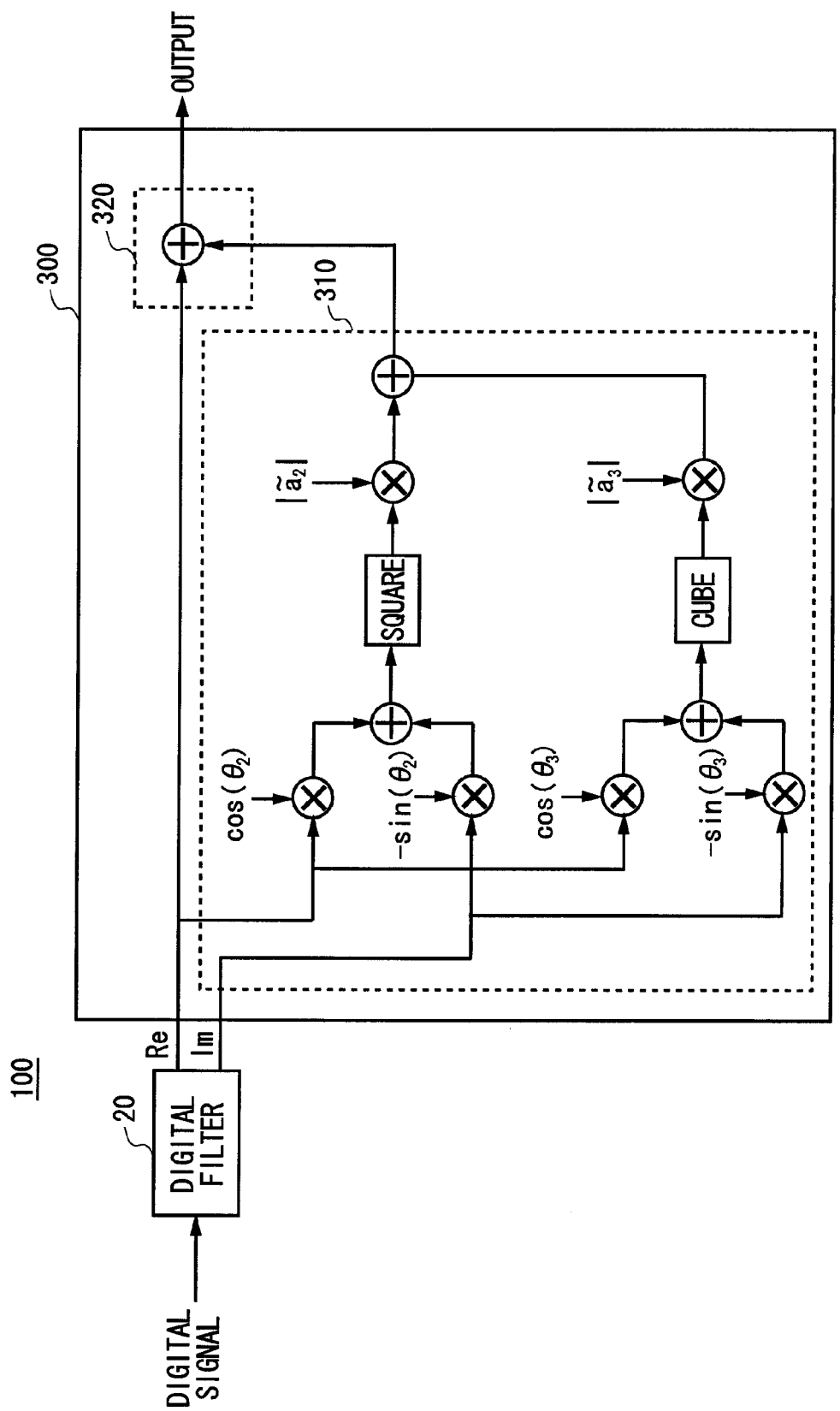
FIG. 13 shows a configuration of a signal processing apparatus 100 according to another embodiment.

FIG. 13 shows a configuration of a signal processing apparatus 100 according to another embodiment. The compensation section 300 in this drawing includes a compensating signal generating section 310 and a subtraction section 320. The compensating signal generating section 310 generates a compensating signal for compensating a non-linear distortion of a digital signal, based on a compensation coefficient and a signal resulting from exponentiating the analysis signal. The subtraction section 320 compensates for the non-linear distortion by subtracting each compensating signal from the digital signal.

Figure 14:
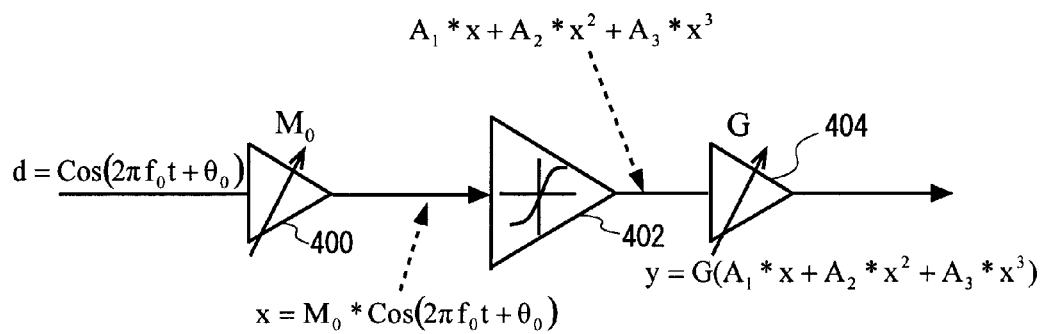
FIG. 14 shows a generation model of a non-linear distortion.

Before the operation of the compensation section 300 is explained, the overview of the compensation algorithm of the non-linear distortion is explained. FIG. 14 shows a generation model of a non-linear distortion. The input signal in this model is assumed to have a frequency $f_0$, and so that $d=\cos(2\pi\theta f_0 t+\theta_0)$ having a phase of $\theta_0$. Since the analog circuit 400 has a gain of $M_0$, $x=M_0 \cos(2\pi f_0 t+\theta_0)$ is outputted to the analog circuit 402.

Next, the analog circuit 402 outputs, to a later-stage analog circuit 404, a signal to which distortion attributed to the non-linearity of the analog circuit 402 is superimposed. Since the analog circuit 404 has a gain of G, the output signal from the analog circuit 404 will be $y=G(A1*x+A2*x2+A3*x3)$.

Figure 15:
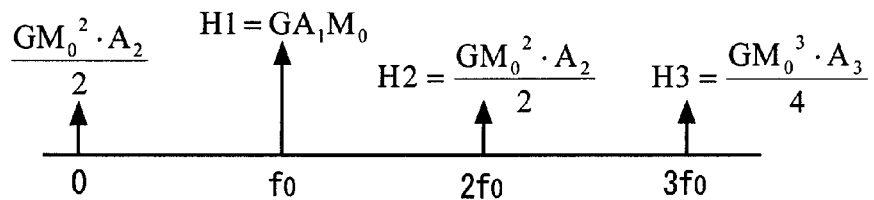
FIG. 15 shows a conceptual diagram of a spectrum of a harmonic distortion contained in an output signal y of an analog circuit 404.

FIG. 15 shows a conceptual diagram of a spectrum of a harmonic distortion contained in an output signal y of an analog circuit 404. $f_0$ represents a fundamental component, $2f_0$ represents a second harmonic component, and $3f_0$ represents a third harmonic component. The amplitude $H_2$ of the second harmonic component and the amplitude $H_3$ of the third harmonic component are calculated as follows.

$$H_2 = \frac{(GM_0 A_1)^2}{2} \cdot \frac{A_2}{GA_1^2} = \frac{(H_1)^2}{2}\tilde{A}_2$$

$$H_3 = \frac{(GM_0 A_1)^3}{4} \cdot \frac{A_2}{G^2 A_1^3} = \frac{(H_1)^3}{4}\tilde{A}_3$$

Accordingly, the compensation coefficients of the second harmonic component and the third harmonic component can be calculated as follows.

$$\tilde{A}_2 = \frac{A_2}{GA_1^2}, \tilde{A}_3 = \cdot \frac{A_2}{G^2 A_1^3}$$

The signal processing apparatus 100 uses the compensation coefficients obtained in the above manner, to generate a compensating signal for compensating a non-linear distortion contained in a signal y as in the following Expression 1.

$$\tilde{y} = \tilde{A}_2 \cdot y^2 + \tilde{A}_3 \cdot y^3$$
$$= \text{Re}|A_2| \cdot (H[y] \cdot e^{-j\theta_2})^2 + |A_3| \cdot (H[y] \cdot e^{-j\theta_3})^3$$

Expression (1)
Here, H(y) represents data resulting from converting the signal y into a complex number, $\theta 2$ represents the phase of a second harmonic wave, and $\theta 3$ represents the phase of a third harmonic wave.

The signal processing apparatus 100 can obtain an analysis signal without any distortion, by subtracting a compensating signal from a signal y. Specifically, if the approximation is performed as follows:

$$y \approx GA_1 x,$$

the signal after compensation is expressed as follows.

$$y - (\tilde{A}_2 \cdot y^2 + \tilde{A}_3 \cdot y^3) \approx y - \left(\frac{A_2}{GA_1^2} \cdot (GA_1 x)^2 + \frac{A_3}{G^2 A_1^3} \cdot (GA_1 x)^3\right)$$
$$= y - (GA_2 x^2 + GA_3 x^3)$$
$$= GA_1 \cdot x$$

This means that an analysis signal without any distortion has resulted.

The digital filter 20 uses a Hilbert filter to generate complex number conversion data of a signal y contained in Expression (1). The compensation section 300 uses the data of the real number portion and the data of the imaginary number portion generated by the digital filter 20 in the operation shown in Expression (1), to generate the compensating signal. The subtraction section 320 subtracts the compensating signal outputted from the compensation section 300 from the real number portion outputted from the digital filter 20, to generate a signal whose non-linear distortion has been compensated for.

Figure 16:
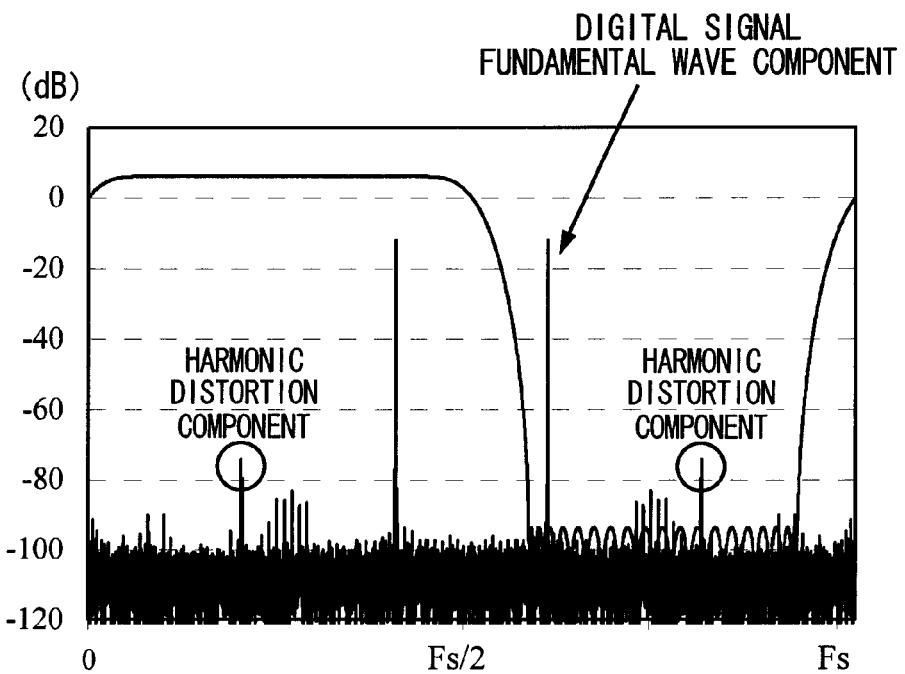
FIG. 16 shows experimental data on a spectrum of a digital signal as well as a frequency characteristic of a digital filter 20 when interleave processing is not performed (N=1).
Figure 17:
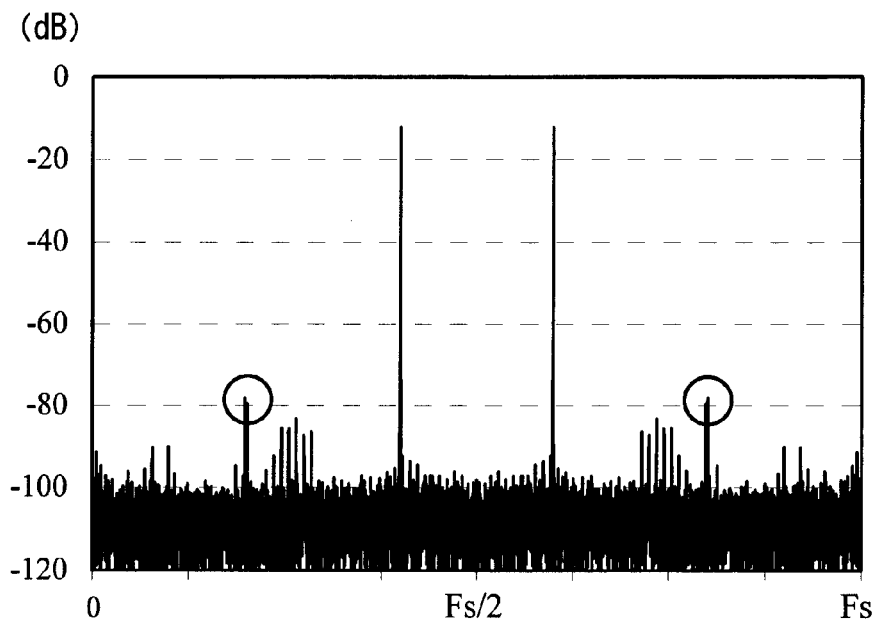
FIG. 17 shows experimental data of a spectrum of a signal outputted by a signal processing apparatus 100.

FIG. 16 shows experimental data on a spectrum of a digital signal as well as a frequency characteristic of a digital filter 20 when interleave processing is not performed (n=1). FIG. 17 shows experimental data of a spectrum of a signal outputted from the signal processing apparatus 100. In both of the drawings, the lateral axis represents a frequency, and the longitudinal axis represents a gain (dB) of the digital filter 20.

The sampling frequency Fs is 100 Msps, a fundamental wave frequency of the digital signal is 60 MHz, and the number of samples is 8192.

FIG. 16 shows, together with a fundamental component of a digital signal, a harmonic component (i.e. folded signal component of a harmonic wave) which causes a waveform distortion. The fundamental wave frequency of the digital signal, however, is contained in the signal eliminating band of the digital filter 20. Therefore, the compensation section 300 cannot obtain the digital signal from the digital filter 20. As a result, the compensation section 300 cannot generate a compensating signal, and it is impossible to remove the harmonic component of the digital signal, from the signal outputted from the signal processing apparatus 100, as shown in FIG. 17.

Figure 18:
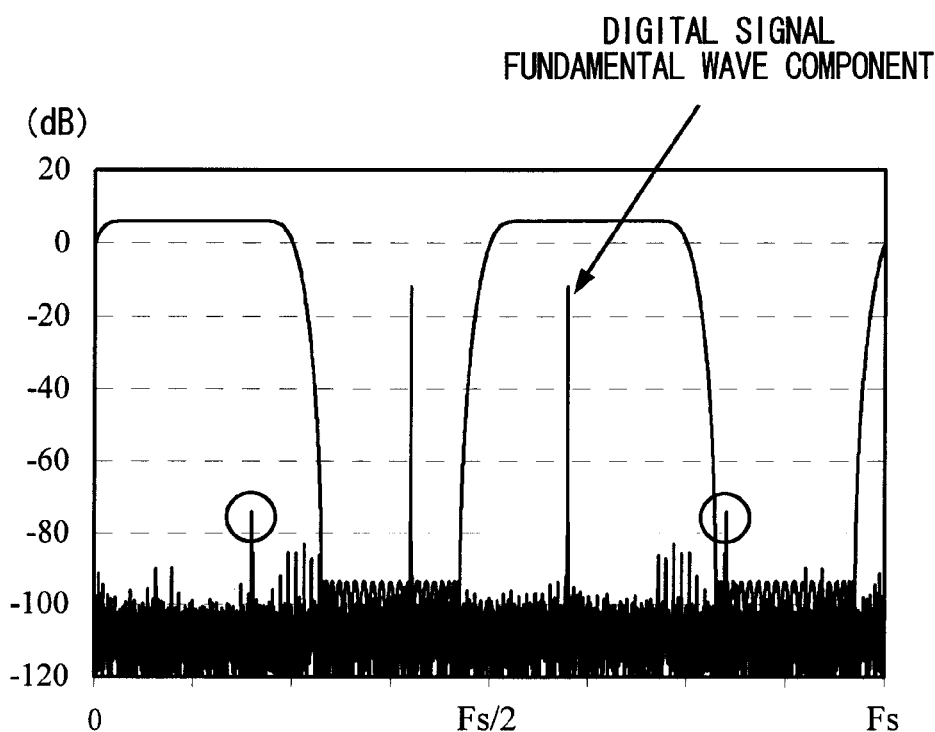
FIG. 18 shows experimental data on a spectrum of a digital signal as well as a frequency characteristic of a digital filter 20 when interleave processing is performed (N=2).
Figure 19:
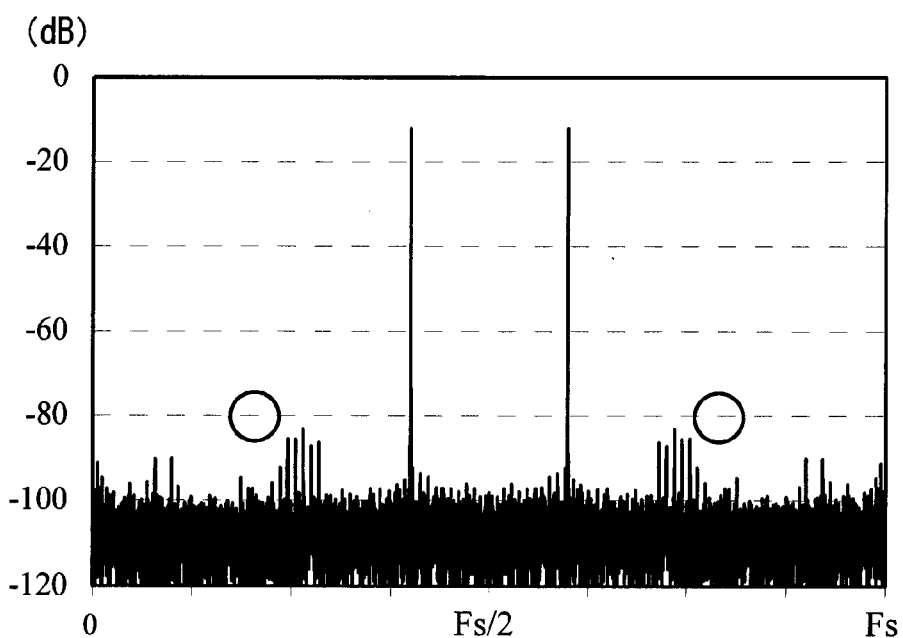
FIG. 19 shows experimental data of a spectrum of a signal outputted by a signal processing apparatus 100.

FIG. 18 shows experimental data on a spectrum of a digital signal as well as a frequency characteristic of a digital filter 20 when interleave processing is performed (N=2). FIG. 19 shows experimental data of a spectrum of a signal outputted by a signal processing apparatus 100. The digital filter 20 of FIG. 18 performs interleave and so has a signal pass band characteristic different from that of the digital filter 20 of FIG. 16, which has the fundamental wave frequency of the digital signal contained in the signal pass band of the digital filter 20.

Since the fundamental wave frequency of the digital signal is contained in the signal pass band of the digital filter 20, the compensation section 300 can obtain the digital signal from the digital filter 20. This allows the compensation section 300 to generate a compensating signal from the digital signal. Consequently, a harmonic component of the digital signal can be removed from the signal outputted from the signal processing apparatus 100, as shown in FIG. 19.

Figure 20:
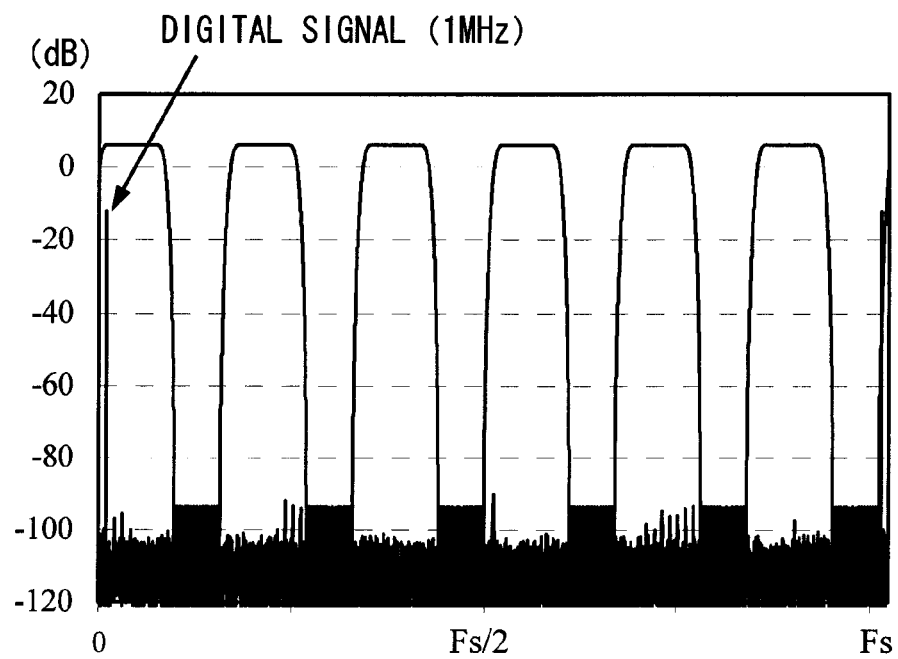
FIG. 20 shows a frequency characteristic of a digital filter 20 when the number of interleaved channels is set to be 6.
Figure 21:
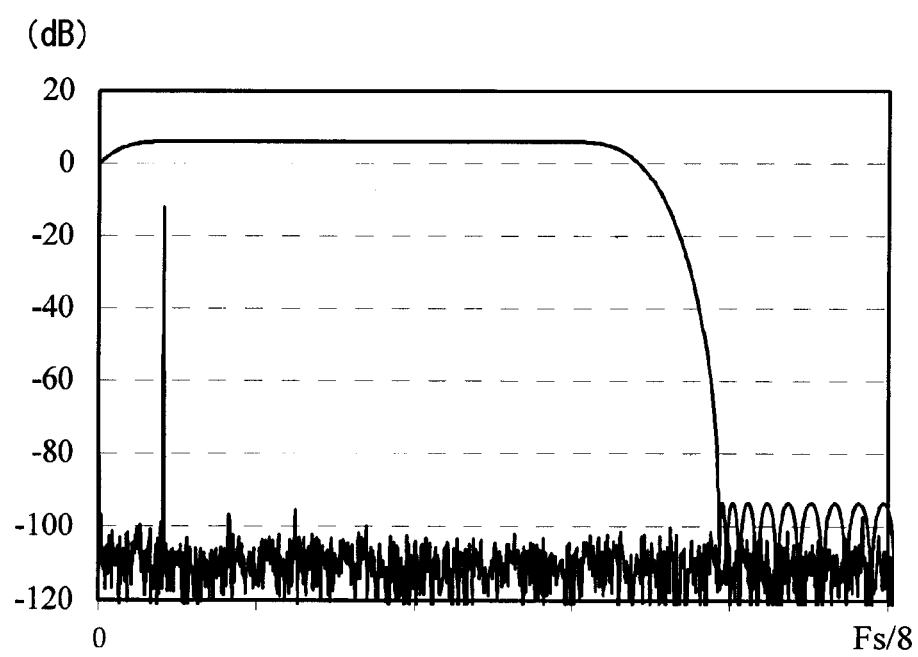
FIG. 21 shows a configuration of a digital filter 20 according to another embodiment.

FIG. 20 shows a frequency characteristic of a digital filter 20 when the number of interleaved channels is set to be 6. FIG. 21 shows an enlarged view of a low frequency region of FIG. 20. In FIG. 20 and FIG. 21, the fundamental wave frequency of the digital signal is 1 MHz corresponding to $\frac{1}{100}$ of the sampling frequency of 100 Msps. According to the increase in the number of interleaved channels in the digital filter 20, the low-frequency cutoff frequency is sufficiently lower than the fundamental wave frequency of the digital signal. As a result, the fundamental wave frequency of the digital signal is contained in the signal pass band of the digital filter 20, as shown in the drawing.

As explained above, in the signal processing apparatus 100 according to the present embodiment, the compensation section 300 generates a compensating signal using the complex number component data of the analysis signal generated by the analysis signal generating section 200, to eliminate a non-linear distortion. In particular, the digital filter 20 changes the number of data sequences, i.e., the number of interleaved channels, to be able to change the frequency characteristic of the filter without changing the number of taps. Therefore, the signal processing apparatus 100 can compensate for the digital signal, after adjusting the filter characteristic to be optimal according to the characteristics such as a frequency of an analysis signal.

Figure 22:
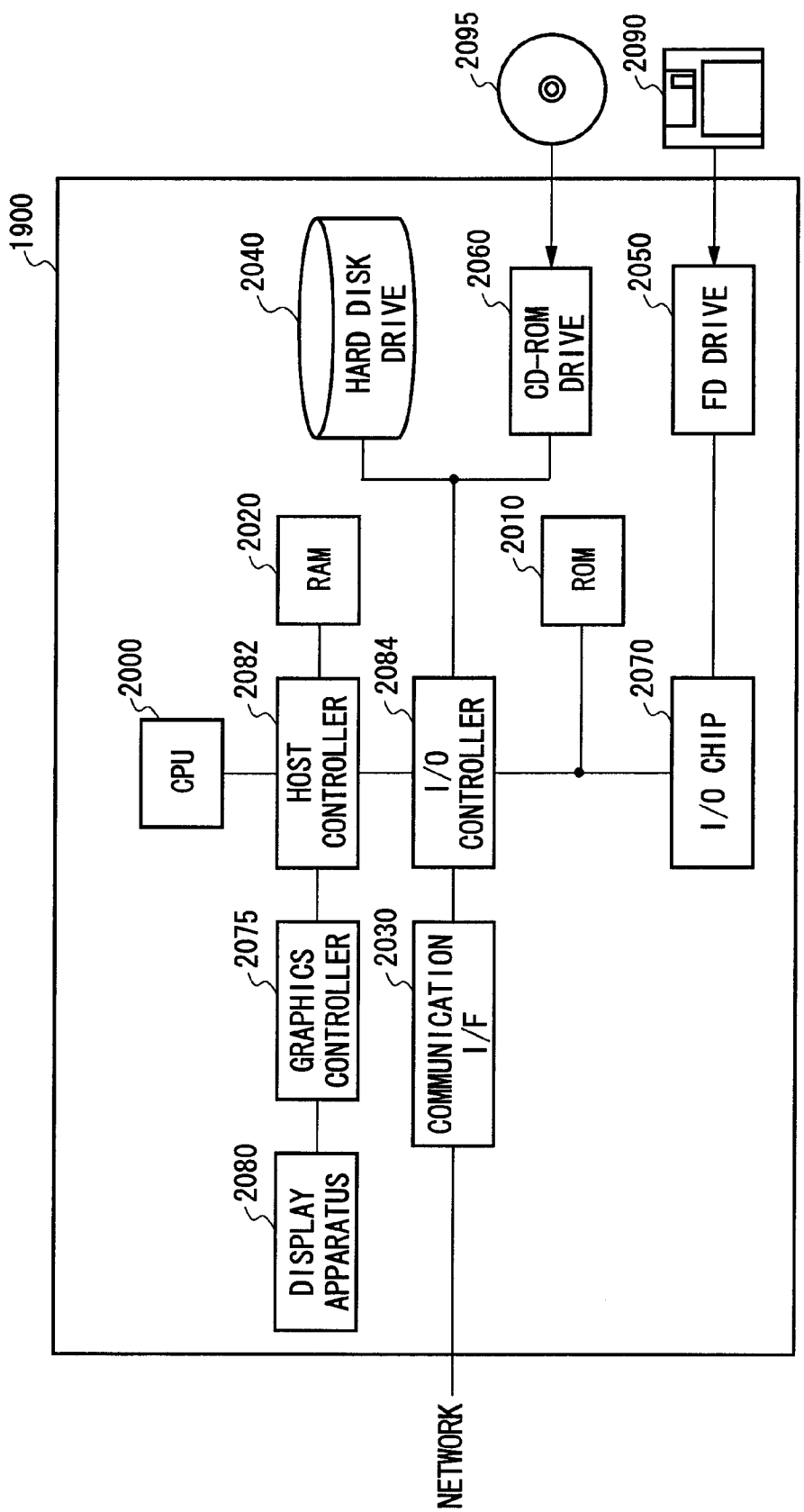
FIG. 22 shows an exemplary hardware configuration of a computer 1900 constituting a signal processing apparatus 100 according to another embodiment.
Figure 23:
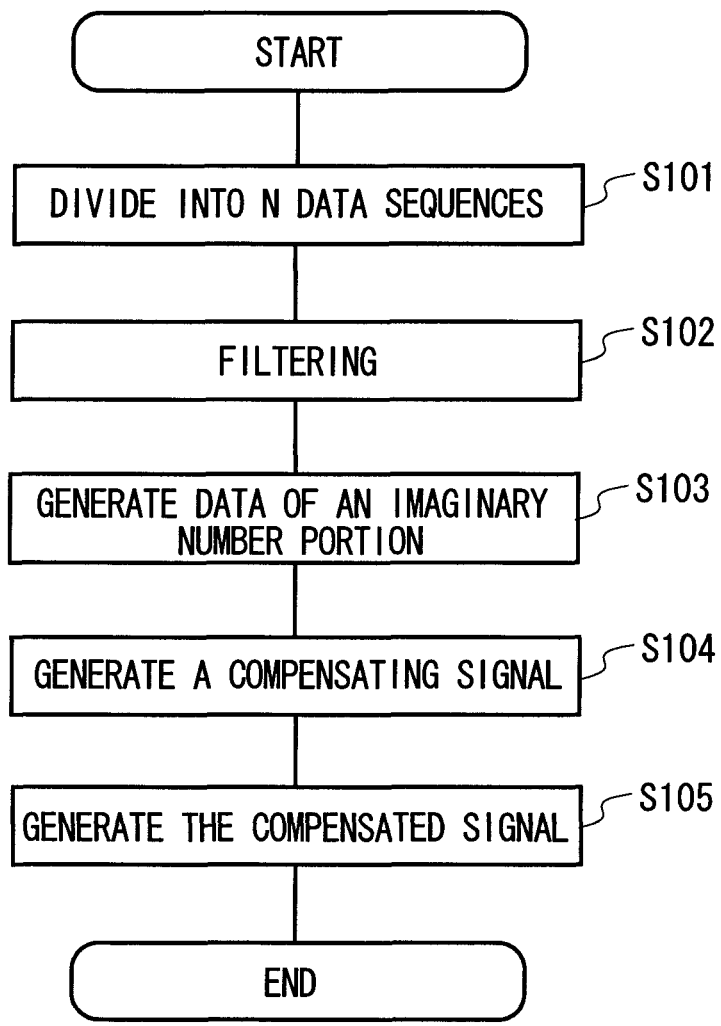
FIG. 23 shows an exemplary operational flowchart of a signal processing apparatus 100 according to the present embodiment.

FIG. 22 shows an exemplary hardware configuration of a computer 1900 constituting a signal processing apparatus 100 according to another embodiment. FIG. 23 shows an exemplary operational flowchart of a signal processing apparatus 100 according to the present embodiment. The computer 1900 according to the present embodiment is equipped with a CPU periphery that includes a CPU 2000, a RAM 2020, a graphics controller 2075, and a display apparatus 2080 which are mutually connected by a host controller 2082. The computer 1900 is also equipped with an input/output unit having a communication interface 2030, a hard disk drive 2040, and a CD-ROM drive 2060 which are connected to the host controller 2082 via an input/output controller 2084, and a legacy input/output unit having a ROM 2010, a flexible disk drive 2050, and an input/output chip 2070 which are connected to the input/output controller 2084.

The host controller 2082 connects the RAM 2020 with the CPU 2000 and the graphics controller 2075 which access the RAM 2020 at a high transfer rate. The CPU 2000 operates according to programs stored in the ROM 2010 and the RAM 2020, thereby controlling each unit. The graphics controller 2075 obtains image data generated by the CPU 2000 or the like on a frame buffer provided in the RAM 2020, and causes the image data to be displayed on the display apparatus 2080. Alternatively, the graphics controller 2075 may contain therein a frame buffer for storing image data generated by the CPU 2000 or the like.

The input/output controller 2084 connects the host controller 2082 with the communication interface 2030, the hard disk drive 2040, and the CD-ROM drive 2060, which are relatively high-speed input/output apparatuses. The communication interface 2030 communicates with other apparatuses via a network. The hard disk drive 2040 stores a program and data used by the CPU 2000 within the computer 1900. The CD-ROM drive 2060 reads the program or the data from the CD-ROM 2095, and provides the hard disk drive 2040 with the program or the data via the RAM 2020.

The ROM 2010, and the flexible disk drive 2050 and the input/output chip 2070 which are relatively low-speed input/output apparatuses are connected to the input/output controller 2084. The ROM 2010 stores therein a boot program executed by the computer 1900 at the time of activation, a program depending on the hardware of the computer 1900, or the like. The flexible disk drive 2050 reads the programs or data from a flexible disk 2090, and provides the hard disk drive 2040 with the programs or data via the RAM 2020. The input/output chip 2070 connects a flexible drive 2050 to an input/output controller 2084, and connects various input/output apparatuses via a parallel port, a serial port, a keyboard port, a mouse port, and the like to the input/output controller 2084.

A program to be provided for the hard disk drive 2040 via the RAM 2020 is provided by a user by being stored in such a recording medium as the flexible disk 2090, the CD-ROM 2095, and an IC card. The program is read from the recording medium, installed into the hard disk drive 2040 within the computer 1900 via the RAM 2020, and executed in the CPU 2000.

A program that is installed in the computer 1900 and causes the computer 1900 to function as a signal processing apparatus 100 causes the computer 1900 to function as an analysis signal generating section 200 that converts a digital signal into a complex number analysis signal using a digital filter 20, and a compensation section 300 that compensates for the analysis signal using a complex number compensation factor corresponding to the non-linear distortion, and causes the digital filter 20 to divide the data of the digital signal into N data sequences ("n" is an integer equal to or greater than 2), assign the (n*L+k)th data (L=0, 1, . . . ) of the digital signal to the k-th data sequence (k=1, 2, . . . , n), perform filtering on the respective data sequences using a same filter coefficient, and generate an imaginary number portion of the analysis signal by combining the respective data sequences after the filtering. The program or module acts on the CPU 2000, to cause the computer 1900 to function as any of the signal processing apparatuses 100 explained above with reference to FIG. 1 through FIG. 21.

Concretely, according to the program, the computer 1900 divides the data of the inputted digital signal into n data sequences in a predetermined order (S101). Next, the computer 1900 uses the same filter coefficient in performing filtering across one data sequence (S102). Next, the computer 1900 combines the data of each data sequence after the filtering, to generate the data of the imaginary number portion of the analysis signal (S103).

The computer 1900 further generates a compensating signal using the data of the imaginary number portion of the generated analysis signal, the data of the real number portion of the analysis signal, and the compensation coefficient having been calculated in advance (S104). The computer 1900 may generate a signal whose non-linear distortion has been compensated for, by subtracting the generated compensating signal from the data of the real number portion of the analysis signal (S105).

The information processing described in these programs is read into the computer 1900, to function as the analysis signal generating section 200 and the compensation section 300, which are the concrete means as a result of cooperation between the software and the above-mentioned various types of hardware resources. Moreover, the signal processing apparatus 100 for the usage is constituted by realizing the operation or processing of information in accordance with the usage of the computer 1900 of the present embodiment by these concrete means.

For example when communication is performed between the computer 1900 and an external apparatus and the like, the CPU 2000 executes a communication program loaded onto the RAM 2020, to instruct communication processing to a communication interface 2030, based on the processing described in the communication program. The communication interface 2030, under control of the CPU 2000, reads the transmission data stored on the transmission buffering region provided in the recording apparatus such as a RAM 2020, a hard disk drive 2040, a flexible disk 2090, or a CD-ROM 2095, and transmits the read transmission data to a network, or writes reception data received from a network to a reception buffering region or the like provided on the recording apparatus. In this way, the communication interface 2030 may exchange transmission/reception data with the recording apparatus by a DMA (direct memory access) method, or by a configuration that the CPU 2000 reads the data from the recording apparatus or the communication interface 2030 of a transfer destination, to write the data into the communication interface 2030 or the recording apparatus of the transfer destination, so as to transfer the transmission/reception data.

In addition, the CPU 2000 causes all or a necessary portion of the file of the database to be read into the RAM 2020 such as by DMA transfer, the file or the database having been stored in an external recording apparatus such as the hard disk drive 2040, the CD-ROM drive 2060 (CD-ROM 2095), the flexible disk drive 2050 (flexible disk 2090), to perform various types of processing onto the data on the RAM 2020. The CPU 2000 then writes back the processed data to the external recording apparatus by means of a DMA transfer method or the like.

In such processing, the RAM 2020 can be considered to temporary store the contents of the external recording apparatus, and so the RAM 2020, the external recording apparatus, and the like are collectively referred to as a memory, a storage section, or a recording apparatus, and so on in the present embodiment. In the present embodiment, various types of information such as various types of programs, data, tables, and databases are stored in the recording apparatus, to undergo information processing. Note that the CPU 2000 may also retain a part of the RAM 2020, to perform reading/writing thereto on the cache memory. In such an embodiment, too, the cache is considered to be contained in the RAM 2020, the memory, and/or the recording apparatus unless noted otherwise, since the cache memory performs part of the function of the RAM 2020.

The CPU 2000 performs various types of processing, onto the data read from the RAM 2020, which includes various types of operations, processing of information, condition judging, search/replace of information, described in the present embodiment and designated by an instruction sequence of programs, and writes the result back to the RAM 2020. For example, when performing condition judging, the CPU 2000 judges whether each type of variables shown in the present embodiment is larger, smaller, no smaller than, no greater than, or equal to the other variable or constant, and when the condition judging results in the affirmative (or in the negative), the process branches to a different instruction sequence, or calls a sub routine.

In addition, the CPU 2000 can search for information in the file or database or the like in the recording apparatus. For example when a plurality of entries, each having an attribute value of a first attribute is associated with an attribute value of a second attribute, are stored in a recording apparatus, the CPU 2000 searches for an entry matching the condition whose attribute value of the first attribute is designated, from among the plurality of entries stored in the recording apparatus, and reads the attribute value of the second attribute stored in the entry, thereby obtaining the attribute value of the second attribute associated with the first attribute satisfying the predetermined condition.

The above-explained program or module can be stored in an external recording medium. Exemplary recording medium include a flexible disk 2090, a CD-ROM 2095, as well as an optical recording medium such as a DVD or a CD, a magneto-optic recording medium such as a MO, a tape medium, and a semiconductor memory such as an IC card. In addition, a recording apparatus such as a hard disk or a RAM provided in a server system connected to a dedicated communication network or the Internet can be used as a recording medium, thereby providing the program to the computer 1900 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A signal processing apparatus for compensating for a non-linear distortion of a digital signal, comprising:
   an analysis signal generating section that converts the digital signal into an analysis signal of a complex number, using a digital filter; and a compensation section that generates a compensating signal based on the analysis signal and on a compensation coefficient of a complex number corresponding to the non-linear distortion, and compensates for the non-linear distortion of the digital signal using the compensating signal, wherein the digital filter divides data of the digital signal into "n" data sequences, assigns (n*L+k)th data of the digital signal to a k-th data sequence, performs filtering on each of the data sequences using a same filter coefficient, and combines each of the data sequences after the filtering, thereby generating an imaginary number portion of the analysis signal, where "n" is an integer equal to or greater than 2, L=0, 1, . . . , and k=1, 2, . . . , n.

2. The signal processing apparatus according to claim 1, wherein the digital filter includes a band controlling section that controls the number "n" corresponding to a number of data sequences in the digital filter, to control a signal pass band of the digital filter.

3. The signal processing apparatus according to claim 2, wherein
the band controlling section controls the number "n" to control a low-frequency cutoff frequency of the signal pass band in the digital filter.

4. The signal processing apparatus according to claim 3, wherein
the band controlling section controls the number "n" to control the low-frequency cutoff frequency of the signal pass band in the digital filter to be lower than a fundamental wave frequency of the digital signal.

5. The signal processing apparatus according to claim 2, wherein
the digital filter further includes:
multipliers that are each provided in association with a corresponding tap of the digital filter, each of the multipliers operable to multiply data of the digital signal inputted to the corresponding tap by the filter coefficient, to calculate a multiplication value; and
delay sections provided between each tap, each of the delay sections operable to delay data exchanged between the taps by a predetermined amount of delay, and
the band controlling section controls the number "n" by controlling the amount of delay in the delay sections.

6. The signal processing apparatus according to claim 5, wherein
the band controlling section controls the amount of delay in the delay sections based on a value obtained by multiplying a sampling period of the digital signal by the number "n".

7. The signal processing apparatus according to claim 5, wherein
the analysis signal generating section generates a real number portion of the analysis signal by delaying the digital signal based on a number of taps in the digital filter and the number "n".

8. The signal processing apparatus according to claim 5, wherein
in each tap of the digital filter, the multiplication value obtained using the filter coefficient is sequentially set according to an order of the tap, and
the band controlling section controls the signal pass band of the digital filter by reversing an order of the multiplication value to each tap.

9. The signal processing apparatus according to claim 5, further comprising:

a decimation section that reduces a number of pieces of data of the digital signal, and inputs, into the digital filter, the reduced number of pieces of data.

10. The signal processing apparatus according to claim 2, wherein
the digital filter includes:
1st to n-th filter sections that are provided in parallel and assigned a same filter coefficient as each other;
a data input section that distributes pieces of data of the digital signal to the filter sections respectively, so that the (n*L+k)th data of the digital signal is sequentially inputted to a k-th filter section; and
a combining, section that combines signals outputted by the filter sections.

11. The signal processing apparatus according to claim 1, wherein
the compensation section includes:
a compensating signal generating section that generates the compensating signal based on a signal obtained by exponentiating the analysis signal and the compensation coefficient; and
a subtraction section that compensates for the non-linear distortion by subtracting the compensating signal from the digital signal.

12. An analysis signal generating apparatus comprising:
a digital filter for filtering a supplied digital signal, which divides data of the digital signal into "n" data sequences, assigns (n*L+k)th data of the digital signal to a k-th data sequence, performs filtering on each of the data sequences using a same filter coefficient, and combines each of the data sequences after the filtering, thereby generating an imaginary number portion of an analysis signal of the digital signal, where "n" is an integer equal to or greater than 2, L=0, 1, . . . , and k=1, 2, . . . , n; and
a delay section that generates a real number portion of the analysis signal by delaying the digital signal based on the number "n".

13. A non-transitory recording medium having recorded therein a program to cause a computer to function as a signal processing apparatus for compensating for a non-linear distortion of a digital signal, comprising:
an analysis signal generating section that converts the digital signal into an analysis signal of a complex number, using a digital filter; and
a compensation section that generates a compensating signal based on the analysis signal and on a compensation coefficient of a complex number corresponding to the non-linear distortion, and compensates for the non-linear distortion of the digital signal using the compensating signal, wherein
the digital filter divides data of the digital signal into "n" data sequences, assigns (n*L=k)th data of the digital signal to a k-th data sequence, performs filtering on each of the data sequences using a same filter coefficient, and combines each of the data sequences after the filtering, thereby generating an imaginary number portion of the analysis signal, where "n" is an integer equal to or greater than 2, L=0, 1, . . . , and k=1, 2, . . . ,n.

14. The signal processing apparatus according to claim 1, further comprising a delay section that generates a real number portion of the analysis signal by delaying the digital signal based on the number "n".

* * * * *